(12) United States Patent
Norval

(10) Patent No.: US 10,541,258 B2
(45) Date of Patent: Jan. 21, 2020

(54) PATTERNING LAYERS STACKS FOR ELECTRONIC DEVICES

(71) Applicant: FLEXENABLE LIMITED, Cambridge (GB)

(72) Inventor: Shane Norval, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 223 days.

(21) Appl. No.: 15/502,795

(22) PCT Filed: Aug. 18, 2015

(86) PCT No.: PCT/EP2015/068943
§ 371 (c)(1),
(2) Date: Feb. 9, 2017

(87) PCT Pub. No.: WO2016/026855
PCT Pub. Date: Feb. 25, 2016

(65) Prior Publication Data
US 2017/0236850 A1 Aug. 17, 2017

(30) Foreign Application Priority Data

Aug. 18, 2014 (GB) .................................. 1414630.2

(51) Int. Cl.
*H01L 27/12* (2006.01)
*H01L 21/033* (2006.01)
*H01L 21/308* (2006.01)

(52) U.S. Cl.
CPC ...... *H01L 27/1296* (2013.01); *H01L 21/0334* (2013.01); *H01L 21/0335* (2013.01);
(Continued)

(58) Field of Classification Search
CPC ............ H01L 21/0334; H01L 21/0335; H01L 27/1288; H01L 21/3085; H01L 27/1296; H01L 21/3083
See application file for complete search history.

(56) References Cited

U.S. PATENT DOCUMENTS 5,302,547 A 4/1994 Wojnarowski et al.
8,883,615 B1 11/2014 Holden et al.
(Continued)

FOREIGN PATENT DOCUMENTS

WO 96/27212 A1 9/1996

OTHER PUBLICATIONS

Scott Corbett et al., "Laser Direct Exposure of Photodefinable Polymer Masks Using Shaped-Beam Optics," IEEE Transactions on Electronics Packaging Manufacturing, Oct. 2005, pp. 312-321, vol. 28, No. 4.

(Continued)

*Primary Examiner* — Savitri Mulpuri
(74) *Attorney, Agent, or Firm* — Sughrue Mion, PLLC

(57) ABSTRACT

There is provided a method of patterning a stack of layers defining one or more electronic device elements, comprising: creating a first thickness profile in an uppermost portion of the stack of layers by laser ablation; and etching the stack of layers to translate the first thickness profile into a second thickness profile at a lower level; wherein the etching reduces the thickness of said uppermost portion of the stack and one or more lower layers of the stack under said uppermost portion.

17 Claims, 3 Drawing Sheets

(52) U.S. Cl.
CPC ...... *H01L 21/3083* (2013.01); *H01L 21/3085* (2013.01); *H01L 27/1288* (2013.01)

(56) References Cited

U.S. PATENT DOCUMENTS

| | | | |
|---|---|---|---|
| 8,932,939 B1 | 1/2015 | Lei et al. | |
| 9,755,010 B2* | 9/2017 | Rankov | H01L 27/3246 |
| 2007/0269937 A1 | 11/2007 | Lin | |
| 2007/0275511 A1 | 11/2007 | Shih et al. | |
| 2009/0087954 A1 | 4/2009 | Lin et al. | |
| 2012/0322240 A1 | 12/2012 | Holden et al. | |
| 2016/0161819 A1* | 6/2016 | Fichet | G02F 1/133514 |
| | | | 359/296 |
| 2016/0233254 A1* | 8/2016 | Riedel | H01L 27/124 |
| 2016/0308153 A1* | 10/2016 | Jongman | H01L 51/055 |
| 2017/0179231 A1* | 6/2017 | Jongman | H01L 27/3248 |
| 2017/0213915 A1* | 7/2017 | Jongman | H01L 51/105 |

OTHER PUBLICATIONS

British Search Report of GB1414630.2 dated Mar. 19, 2015.
Written Opinion of the International Searching Authority of PCT/EP2015/068943 dated Nov. 5, 2015.
International Search Report of PCT/EP2015/068943 dated Nov. 5, 2015.

* cited by examiner

PATTERNING LAYERS STACKS FOR ELECTRONIC DEVICES

CROSS REFERENCE TO RELATED APPLICATIONS

This application is a National Stage of International Application No. PCT/EP2015/068943 filed Aug. 18, 2015, claiming priority based on British Patent Application No. 1414630.2 filed Aug. 18, 2014, the contents of all of which are incorporated herein by reference in their entirety.

The production of electronic devices may comprise patterning one or more layers of a stack of layers.

One conventional patterning process involves exposing all of the one or more layers to be patterned to laser radiation at a frequency and energy capable of ablating the layers in the irradiated regions. Laser ablation can be a simple, effective patterning technique in the production of electronic devices, but it can have some limitations, such as concerns about damage to radiation-sensitive elements, and the need to use, for the one or more layers to be patterned, materials that exhibit a sufficiently high absorptivity at the laser frequency.

The inventors for the present application have identified the challenge of developing a new patterning technique that retains the advantages of laser ablation but with fewer limitations.

There is hereby provided a method of patterning a stack of layers defining one or more electronic device elements, comprising: creating a first thickness profile in an uppermost portion of the stack of layers by laser ablation; and etching the stack of layers to translate the first thickness profile into a second thickness profile at a lower level; wherein the etching reduces the thickness of said uppermost portion of the stack and one or more lower layers of the stack under said uppermost portion.

According to one embodiment, said first thickness profile comprises one or more first regions in which said uppermost portion of the stack has a first non-zero thickness, and one or more second regions in which said uppermost portion of the stack has a second non-zero thickness smaller than said first non-zero thickness, and wherein said etching reduces the thickness of said one or more lower layers in said second region without reducing the thickness of said one or more lower layers under in said one or more first regions.

According to one embodiment, said uppermost portion of the stack consists of one or more upper layers of the stack.

According to one embodiment, reducing the thickness of said one or more lower layers comprises reducing the thickness of said one or more lower layers to zero.

According to one embodiment, said first thickness profile comprises one or more first regions in which said uppermost portion of the stack has a first thickness, and one or more second regions in which said uppermost portion of the stack has a second thickness smaller than said first thickness; and the etching reduces the thickness of the stack in said one or more first regions by a first amount, and reduces the thickness of the stack in said one or more second regions by a second amount, wherein said first amount is substantially no less than 10% of said second amount.

According to one embodiment, the stack of layers includes a layer of semiconductor material providing the semiconductor channels of an array of transistors; and the method comprises stopping the laser ablation at a level above the layer of semiconductor channel material, and wherein etching the stack of layers comprises etching the layer of semiconductor channel material.

According to one embodiment, the second thickness profile defines holes extending down through one or more non-conductor layers of the stack of layers to a conductor layer of the stack of layers.

There is also hereby provided a method of patterning a stack of layers defining one or more electronic device elements, comprising: creating a first thickness profile in a sacrificial, uppermost portion of the stack of layers by laser ablation; etching the stack of layers to translate the first thickness profile into a second thickness profile at a lower level, said second thickness profile partially defined by residual portions of said sacrificial, uppermost portion; removing said residual portions of said sacrificial, uppermost portion to expose unetched regions of one or more underlying layers; and forming one or more further layers over said unetched regions of said one or more underlying layers.

Embodiments of the invention are described in detail hereunder, by way of example only, with reference to the accompanying drawings, in which:—

Figure 1A:
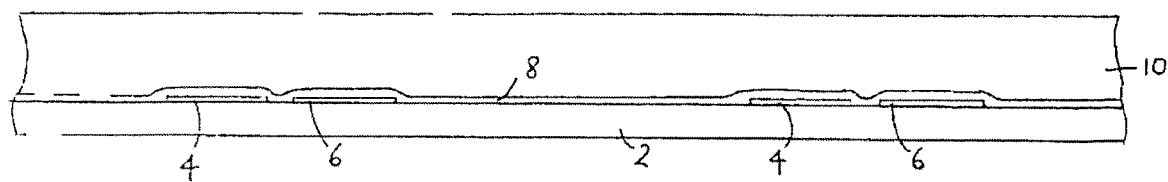
FIG. 1 is a schematic cross-sectional view illustrating a technique according to a first embodiment of the claimed invention.
Figure 1B:
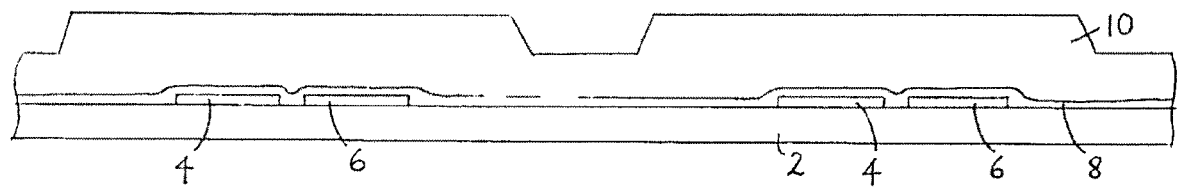
Figure 1C:
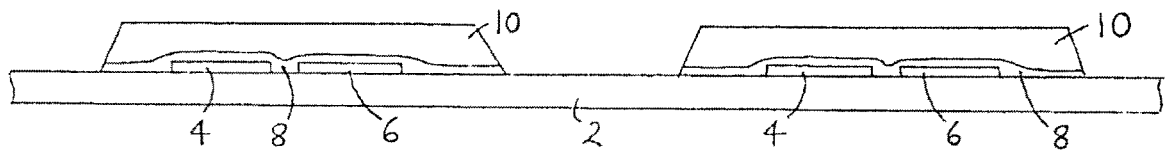
Figure 1D:
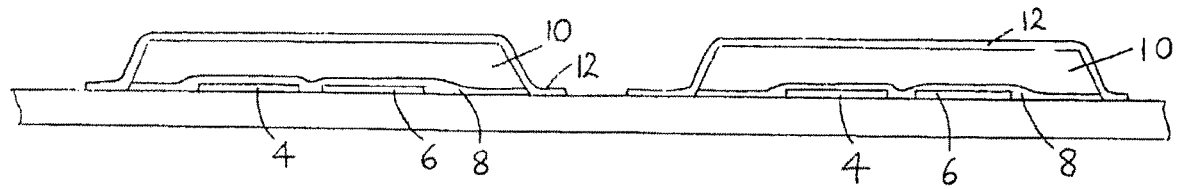

FIG. 1 illustrates an example of a technique according to a first embodiment of the claimed invention. The example relates to the patterning of a semiconductor/gate dielectric stack for top-gate TFTs, but the same technique is also applicable, for example, to the patterning of the same kind of stack for bottom-gate TFTs, and to the patterning of other kinds of stacks for both top-gate and bottom-gate TFTs.

With reference to FIG. 1, on a supporting substrate 2 (such as a flexible plastic film with one or more coatings on its upper surface such as an organic planarisation layer) is formed a first patterned conductor layer defining at least (i) source conductors 4 each providing the source electrodes for a respective row of TFTs and each connected to a respective terminal of a source driver chip, and (ii) drain conductors each providing the drain electrode for a respective TFT. Over the patterned conductor layer is formed a layer 8 of semiconductor material defining the semiconductor channels of the TFTs. Over the semiconductor layer 8 is formed one or more layers 10 of one or more insulating, dielectric materials. The dielectric layer(s) 10 are then patterned by laser ablation to define a topographic profile in the uppermost portion of the stack. The stack is then subject to a dry etching process such as reactive ion etching (RIE) to translate the topographic profile to a lower level in the stack, as shown in FIG. 1c. In this example, the reactive ion etching removes semiconductor material 8 in selected regions outside of the channel areas and source/drain electrode areas. The gate dielectric material(s) remains in the region of the semiconductor channel areas and the source/drain electrode areas, and functions (in the final device) to capacitatively couple the gate conductors with the semiconductor channels of the TFT. The thickness of the gate dielectric layer(s) in these regions is reduced as a result of the global etching, but the original thickness of the gate dielectric layer(s) is selected taking into account this reduction.

In the case that the gate dielectric 10 comprises a stack of layers exhibiting different etching rates, the topographic profile after etching may differ to the topographic profile directly after laser ablation, but the topographic profile after etching is nonetheless determined by the topographic profile created by the laser ablation.

Over the resulting patterned structure is deposited a conformal conductor layer 10, such as a metal layer, which is then patterned by e.g. laser ablation or photolithography to define gate conductors extending down to the supporting substrate 2, each gate conductor providing the gate electrodes for a respective column of TFTs and each connected to a respective terminal of a gate driver chip. The use of laser ablation to define the topographic profile of the semiconductor/dielectric stack after etching facilitates the formation of a topographic profile in the semiconductor/dielectric stack after etching that is more conducive to the formation of a conductor layer that is of substantially uniform thickness over the entire area of the TFT array including in the regions where the conductor layer extends from one level down to another. For example, achieving a good metal thickness also in these regions can be advantageous for better shielding the semiconductor channels from light to which they are sensitive. Also, removing the semiconductor material in regions outside the channel areas can act to reduce parasitic leakages between conductors not associated with the same TFT, such as the source conductor providing the source electrodes for a row of TFTs and a drain conductor for a TFT in a different row of TFTs.

FIG. 1 only shows those elements essential for explaining the first embodiment. Examples of elements not shown include: pixel conductors each connected within the stack to the drain conductor of a respective TFT; and the optical display medium controlled via the pixel conductors.

FIG. 2 illustrates an example of a technique according to a second embodiment of the claimed invention. Again, the example relates to the patterning of a semiconductor/gate dielectric stack for top-gate TFTs, but the same technique is also applicable, for example, to the patterning of the same kind of stack for bottom-gate TFTs, and to the patterning of other kinds of stacks for both top-gate and bottom-gate TFTs.

On a supporting substrate 2 (which may e.g. comprise a flexible plastic support film coated with one or more layers such as an organic planarisation layer) is formed a stack of layers comprising: (i) a patterned conductor layer defining source conductors 4 each providing the source electrodes for a respective row of TFTs of the array of TFTs and connected to a respective terminal of a source driver chip, and drain conductors each providing the drain electrode for a respective TFT; (ii) a patterned semiconductor layer 8 providing the semiconductor channels for the array of TFTs; (iii) one or more gate dielectric layers 10 over the patterned semiconductor layer; (iv) a second patterned conductor layer 12 over the gate dielectric layer(s) 10 and defining gate conductors each providing the gate electrodes for a respective column of TFTs and each connected to a respective terminal of a gate driver chip; and (v) one or more insulating, passivation layers 14 over the second patterned conductor layer.

Figure 2A:
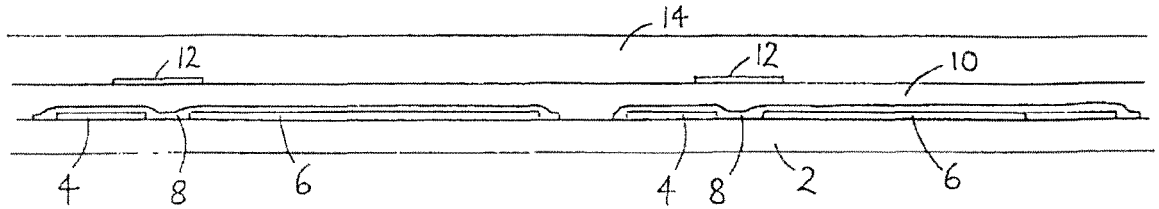
FIG. 2 is a schematic cross-sectional view illustrating a technique according to a second embodiment of the claimed invention.
Figure 2B:
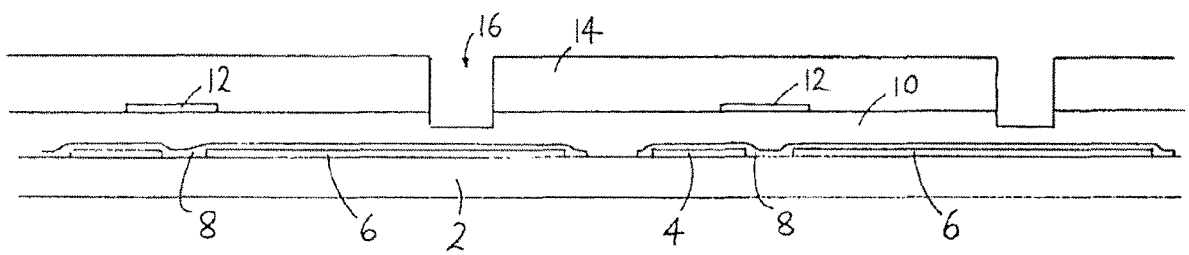
Figure 2C:
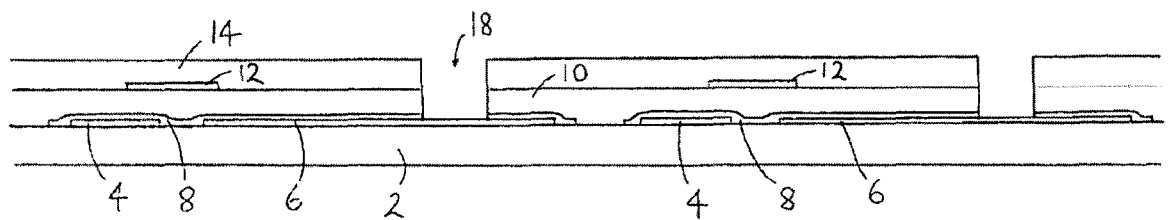
Figure 2D:
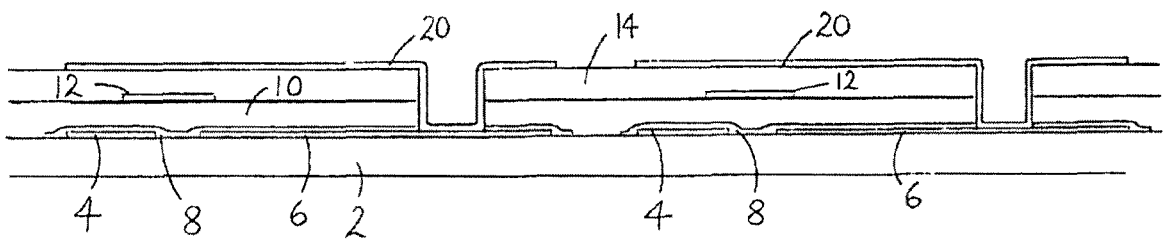

This stack is then patterned by laser ablation to remove an upper portion of the stack in selected regions where a conductive connection is to be created to underlying conductor elements, such as the drain conductors in this example. The laser ablation is stopped short of the semiconductor layer 8, but the topographic profile created by laser ablation extends down into the gate dielectric layer(s) 10. The stack is then subject to a dry etching process such as reactive ion etching (RIE) which translates the topographic profile created by laser ablation to a lower level in the stack, as shown in FIG. 2c. Portions of the drain conductors are exposed by the etching process, but the passivation material(s) 12 remain in other regions but with a reduced thickness as a result of the etching. Where, for example, the passivation layer(s) 12 and the gate dielectric layer(s) 10 exhibit different etching rates, the topographic profile after etching may differ to the topographic profile after laser ablation but before etching; but the topographic profile after etching is nonetheless determined by the topographic profile created by laser ablation. The initial thickness of the passivation layer(s) 12 is chosen such that the etching process after laser ablation exposes the drain conductors 6 in the selected regions whilst leaving a sufficient thickness of passivation material in other regions. Further conductor material is then deposited by a conformal deposition technique over the etched stack, and then patterned by e.g. laser ablation or photolithography to define an array of pixel conductors, each connected to the drain conductor of a respective TFT.

FIG. 2 also only shows those elements essential for explaining the second embodiment. Examples of elements not shown include: the optical medium whose optical output is controlled via the pixel conductors.

Advantages of this technique illustrated by FIG. 2 include the following. Firstly, the technique avoids the use of a photoresist and a post-patterning resist strip process; and there is therefore no concern about the passivation layers 14 being dissolved by the solvent used in the resist-strip process. Secondly, this technique facilitates the use of gate dielectric materials (or other materials in a lower portion of the stack) that exhibit lower absorption at the laser frequency than the passivation material(s) or other materials in an upper portion of the stack.

In the processes of FIGS. 1 and 2, laser ablation is used to define a topographic profile in a layer that remains in the completed device. According to one variation, the uppermost layer is a sacrificial layer that does not remain in the completed device but protects the underlying layer during the production process. For example, the uppermost layer comprises a photoresist material, and the etching process results in a significant reduction of the thickness of the photoresist layer, but the starting thickness (thickness after laser ablation patterning but before etching) of the photoresist layer in at least some regions (e.g. regions surrounding via-holes to an underlying layer) is such that the photoresist layer remains in those regions after completion of the etching process so as to protect the underlying layer in those regions throughout the whole of the etching process. All remaining portions of the photoresist layer are removed after completion of the etching process to expose an unetched, smooth surface of the underlying layer in those regions, which facilitates the formation of e.g. planar conductive elements 20 such as e.g. display pixel electrodes 20 or sensor electrodes in those regions. In this variation of the example of FIG. 2, layer 14 may comprise two sub-layers including an uppermost sacrificial, photoresist layer; and the uppermost, photoresist layer remains (with a reduced thickness) in all regions outside via holes 18 after both laser ablation patterning and etching; and the whole of the remainder of the uppermost, photoresist layer is removed after completion of laser ablation and etching by a process that does not result in removal of the layer directly beneath the photoresist layer.

FIG. 3 illustrates an example of another technique. This example relates to the formation of via connections between the drain conductor of a top-gate switch TFT for a pixel and the gate conductor of a top-gate drive TFT for the same pixel; but the same technique is also applicable, for example, to the formation of via connections for the same purpose in other kinds of TFT devices or for other purposes in the same or other kinds of TFT devices. For example, the same kind of technique may be used, for example, to form via connections between gate conductors and underlying conductor elements at the periphery of the TFT array to facilitate routing of the gate conductors to one or more gate driver chips.

On a supporting substrate 18 is formed a stack of layers comprising: (a) a patterned conductor layer defining (i) source conductors 20 each providing the source electrodes for a respective row of switch TFTs and connected to a respective terminal of a source driver chip, (ii) drain conductors 22 each providing the drain electrode for a respective switch TFT, (iii) one or more source conductors 24 providing the source electrodes for the drive TFTs, and connected to a common biased voltage source, and (iv) drain conductors 26 each providing the drain electrode for a respective drive TFT; (b) a patterned semiconductor layer 28 providing the semiconductor channels for the switch and drive TFTs; one or more gate dielectric layers 30 over the patterned semiconductor layer 28; and a second blanket conductor layer 32 over the gate dielectric layer(s) 10.

Figure 3A:
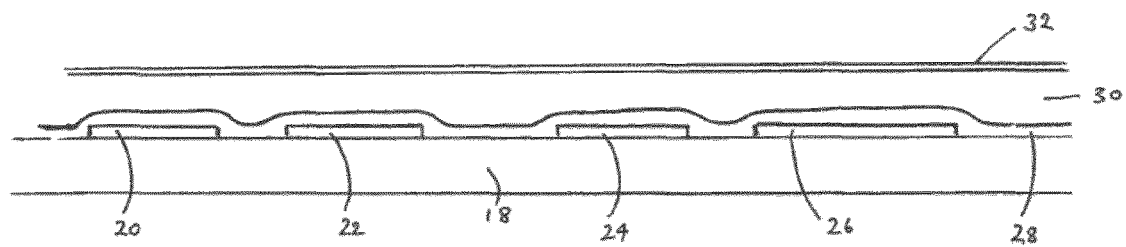
FIG. 3 is a schematic cross-sectional view illustrating another technique.
Figure 3B:
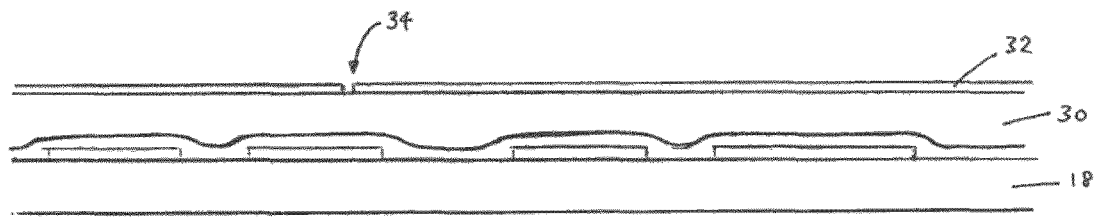
Figure 3C:
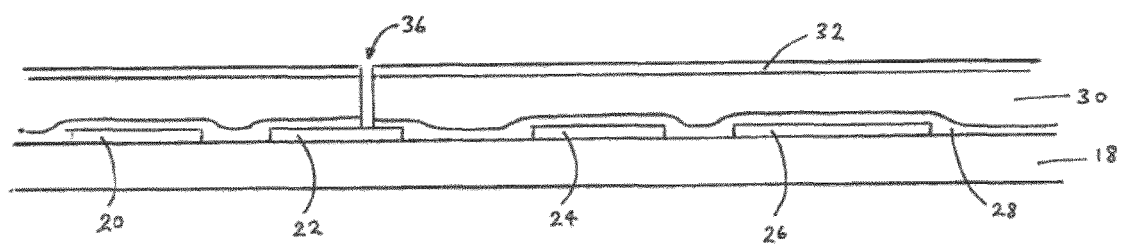
Figure 3D:
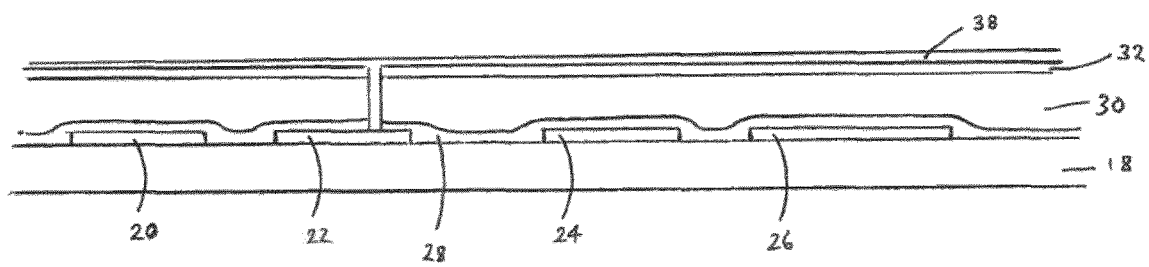
Figure 3E:
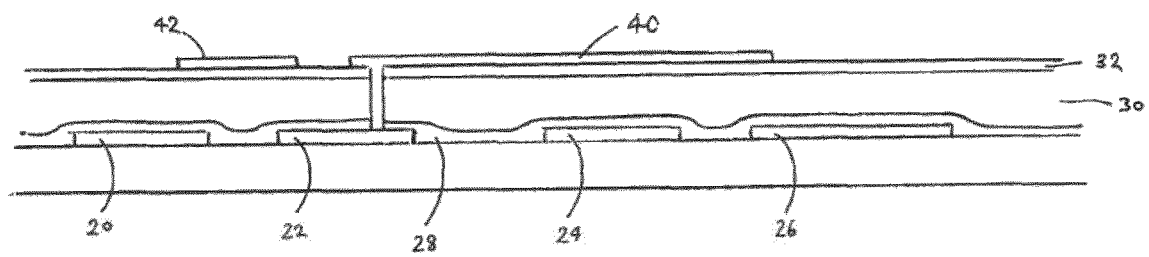

The stack is then patterned by laser ablation to remove the upper conductor material 32 of the stack in selected regions where a conductive connection is to be created to underlying conductor elements, such as the switch TFT drain conductors 22 in this example. The laser ablation removes the entire thickness of the second conductor material in the selected regions 34, and the topographic profile created by the laser ablation may or may not extend down into the gate dielectric layer(s) 30. The stack is then subject to a dry etching process such as reactive ion etching (RIE) which translates the topographic profile created by laser ablation to a lower level in the stack, as shown in FIG. 3c. In this example, the conductor layer is substantially resistant to reactive ion etching, and the topographic profile before etching is therefore different to the topographic profile after etching, but the laser ablation nonetheless determines the topographic profile after etching, and more particularly in this example, where via-holes 36 are formed down to the switch TFT drain conductors 22.

Further conductor material 38 is then deposited by a conformal deposition technique over the entire area of the TFT array to form conductive connections down to the switch TFT conductors, and then patterned by e.g. laser ablation or photolithography to define (i) an array of switch TFT gate conductors 42 each providing the gate electrode for the switch TFTs of a respective column of pixels and each connected to a respective terminal of a gate driver chip, and (ii) an array of gate conductors 40 each providing the gate electrode for a respective drive TFT and connected to the drain conductor of the switch TFT for the same pixel.

FIG. 3 only shows those elements essential for explaining the third embodiment. Examples of elements not shown are: pixel conductors each connected within the stack to the drain electrode of a respective drive TFT, each pixel conductor controlling a respective pixel area of a current-driven optical display medium, such as a light-emissive device.

The above-described techniques are not limited to the use of any specific materials for each of the layers. However, examples of materials for the conductor layers are metal layers or stacks of two or more metal sub-layers; examples of materials for the semiconductor layer are organic conjugated semiconducting polymers; and examples of materials for the gate dielectric and passivation layers are organic polymers.

In addition to any modifications explicitly mentioned above, it will be evident to a person skilled in the art that various other modifications of the described embodiments may be made within the scope of the invention.

The invention claimed is:

1. A method of patterning a stack of layers defining one or more electronic device elements, comprising:
   creating a first thickness profile in an uppermost portion of the stack of layers by laser ablation; and
   etching the stack of layers to translate the first thickness profile into a second thickness profile at a lower level of the stack;
   wherein the etching reduces the thickness of said uppermost portion of the stack and one or more lower layers of the stack under said uppermost portion;
   wherein creating said first thickness profile comprises stopping the laser ablation midway through a first layer of the uppermost portion;
   wherein said etching comprises etching one or more layers below said first layer, and
   wherein said laser ablation removes an upper portion of the stack in selected regions;
   wherein said etching comprises etching the stack in said selected regions and outside the selected regions to leave an etched surface in said selected regions and outside said selected regions; and
   wherein the method further comprises depositing material over the etched surface in said selected regions and outside said selected regions.

2. A method according to claim 1, wherein said first thickness profile comprises one or more first regions in which said uppermost portion of the stack has a first non-zero thickness, and one or more second regions in which said uppermost portion of the stack has a second non-zero thickness smaller than said first non-zero thickness, and wherein said etching reduces the thickness of said one or more lower layers in said second region without reducing the thickness of said one or more lower layers under in said one or more first regions.

3. A method according to claim 1, wherein said uppermost portion of the stack consists of one or more upper layers of the stack.

4. A method according to claim 1, wherein reducing the thickness of said one or more lower layers comprises reducing the thickness of said one or more lower layers to zero.

5. A method according to claim 1, wherein said first thickness profile comprises one or more first regions in which said uppermost portion of the stack has a first thickness, and one or more second regions in which said uppermost portion of the stack has a second thickness smaller than said first thickness; and the etching reduces the thickness of the stack in said one or more first regions by a first amount, and reduces the thickness of the stack in said one or more second regions by a second amount, wherein said first amount is substantially no less than 10% of said second amount.

6. A method according to claim 1, wherein the stack of layers includes a layer of semiconductor material providing the semiconductor channels of an array of transistors; and the method comprises stopping the laser ablation at a level above the layer of semiconductor channel material, and wherein etching the stack of layers comprises etching the layer of semiconductor channel material.

7. A method according to claim 1, wherein the second thickness profile defines holes extending down through one or more non-conductor layers of the stack of layers to a conductor layer of the stack of layers.

8. A method according to claim 1,
wherein said first layer comprises a lower layer of two insulating layers; and
wherein creating said first thickness profile comprises laser ablating down through the entire thickness of an upper layer of said two insulating layers, laser ablating down through an upper portion of said lower layer of said two insulating layers, and stopping the laser ablation short of the bottom of said lower layer of said two insulating layers; and said etching comprises etching one or more layers below said lower layer of said two insulating layers.

9. A method according to claim 8,
wherein said lower layer of said two insulating layers is directly above a semiconductor layer providing the semiconductor channels for one or more transistors; and said etching comprises etching said semiconductor layer.

10. The method according to claim 1,
wherein the stack of layers is formed on a substrate; wherein said laser ablation of the stack of layers is done without ablating the substrate; and
wherein said etching of the stack of layers is done without etching the substrate.

11. The method according to claim 10, wherein the substrate comprises a flexible plastic support film.

12. The method according to claim 10, wherein said etching exposes conductors formed on said substrate.

13. A method of patterning a stack of layers defining one or more electronic device elements, comprising:
creating a first thickness profile in an uppermost portion of the stack of layers by laser ablation; and
etching the stack of layers to translate the first thickness profile into a second thickness profile at a lower level of the stack;
wherein the etching reduces the thickness of said uppermost portion of the stack and one or more lower layers of the stack under said uppermost portion;
wherein creating said first thickness profile comprises removing an upper portion of a first layer by laser ablation and stopping said laser ablation short of the bottom of said first layer;
wherein said etching comprises etching one or more layers below said first layer, and wherein said laser ablation removes an upper portion of the stack in selected regions;
wherein said etching comprises etching the stack in said selected regions and outside the selected regions to leave an etched surface in said selected regions and outside said selected regions; and
wherein the method further comprises depositing material over the etched surface in said selected regions and outside said selected regions.

14. The method according to claim 13, wherein the stack of layers is formed on a substrate; wherein said laser ablation of the stack of layers is done without ablating the substrate; and wherein said etching of the stack of layers is done without etching the substrate.

15. The method according to claim 14, wherein said etching exposes conductors formed on said substrate.

16. A method of patterning a stack of layers defining one or more electronic device elements, comprising:
creating a first thickness profile in an uppermost portion of the stack of layers by laser ablation; and etching the stack of layers to translate the first thickness profile into a second thickness profile at a lower level of the stack;
wherein the etching reduces the thickness of said uppermost portion of the stack and one or more lower layers of the stack under said uppermost portion;
wherein said first thickness profile extends partially down through a dielectric layer of the stack directly above a semiconductor layer of the stack;
wherein said etching comprises etching said semiconductor layer, and
wherein said laser ablation removes an upper portion of the stack in selected regions;
wherein said etching comprises etching the stack in said selected regions and outside the selected regions to leave an etched surface in said selected regions and outside said selected regions; and
wherein the method further comprises depositing material over the etched surface in said selected regions and outside said selected regions.

17. The method according to claim 16, wherein the stack of layers is formed on a substrate; wherein said laser ablation of the stack of layers is done without ablating the substrate; and wherein said etching of the stack of layers is done without etching the substrate.

* * * * *